(12) United States Patent
Li

(10) Patent No.: US 9,491,889 B2
(45) Date of Patent: Nov. 8, 2016

(54) FIXING MECHANISM AND ELECTRONIC DEVICE WITH HEAT DISSIPATING FUNCTION

(71) Applicant: Wistron Corporation, New Taipei (TW)

(72) Inventor: Chen-Yu Li, New Taipei (TW)

(73) Assignee: Wistron Corporation, New Taipei (TW)

( * ) Notice: Subject to any disclaimer, the term of this patent is extended or adjusted under 35 U.S.C. 154(b) by 27 days.

(21) Appl. No.: 14/788,801

(22) Filed: Jul. 1, 2015

(65) Prior Publication Data

US 2016/0234966 A1 Aug. 11, 2016

(30) Foreign Application Priority Data

Feb. 6, 2015 (TW) .............................. 104104109 A

(51) Int. Cl.
*H05K 7/20* (2006.01)
*F04D 29/64* (2006.01)
*F16M 13/02* (2006.01)

(52) U.S. Cl.
CPC .......... *H05K 7/20172* (2013.01); *F16M 13/02* (2013.01); *F04D 29/646* (2013.01)

(58) Field of Classification Search
CPC .............. H05K 7/20172; F16M 13/02; F04D 29/60–29/604; F04D 29/64–29/646; F04D 25/08; F04D 25/12
USPC ....................... 361/679.46–679.54, 688–723; 415/213.1; 417/360, 363, 423.15, 417/423.14
See application file for complete search history.

(56) References Cited

U.S. PATENT DOCUMENTS

| 6,611,427 B1* | 8/2003 | Liao ...................... F04D 25/166 165/121 |
| 7,494,408 B2* | 2/2009 | Chen .................. H05K 7/20172 361/695 |
| 8,757,971 B2* | 6/2014 | Zeng .................... F04D 25/0613 415/213.1 |
| 8,784,167 B2* | 7/2014 | Yi ...................... H05K 7/20172 361/679.49 |
| 9,011,093 B2* | 4/2015 | Mao .................... H05K 7/20172 415/213.1 |

FOREIGN PATENT DOCUMENTS

| TW | 201226713 | 7/2012 |
| TW | M481295 | 7/2014 |

\* cited by examiner

*Primary Examiner* — Zachary M Pape
(74) *Attorney, Agent, or Firm* — Winston Hsu; Scott Margo

(57) ABSTRACT

An electronic device with heat dissipating function has a fixing mechanism, and the fixing mechanism includes a casing, a positioning component, a fixing component and a resilient component. The casing includes a blocking slab, lateral slabs connected with each other, and a constraining portion disposed on the lateral slabs. The positioning component is disposed inside the casing, and a fan unit is slidably disposed on the positioning component. The fixing component includes a contacting portion and a guiding portion. The guiding portion is disposed on the contacting portion, and the contacting portion is slidably disposed on the positioning component. The guiding portion can move in/out of an outlet of the casing. The resilient component is disposed on the positioning component, and pushes the contacting portion to press the fan unit onto the constraining portion.

22 Claims, 9 Drawing Sheets

FIXING MECHANISM AND ELECTRONIC DEVICE WITH HEAT DISSIPATING FUNCTION

BACKGROUND OF THE DISCLOSURE

1. Field of the Disclosure

The present disclosure relates to an electronic device with heat dissipating function, and more particularly, to a fixing mechanism capable of assembling/disassembling one or more fan units quickly and conveniently to combine a fan module and an electronic device having the foresaid fixing mechanism for the heat dissipating function.

2. Description of the Prior Art

With the advanced technology, the electronic device generates heat due to the progressive operational processing function, and operational processing speed of the electronic device may be decelerated since the heat cannot be dissipated effectively. The conventional electronic device normally utilizes an air-cooling heat-dissipating module, such as the fan module, to exhaust hot air inside the electronic device. The fan module is combined by a plurality of fan units to increase its heat dissipating efficiency. The fan module includes a plurality of fixing mechanisms which are the same and each fixing mechanism is matched with one fan unit, the fan unit is fixed on a supporter inside the electronic device. The conventional fixing mechanism utilizes the bolts, the screws and/or the rivets to lock the fan unit on the supporter, assembling/disassembling procedures of the conventional fixing mechanism is complicated and inconvenient, and does not conform to actual demand nowadays.

SUMMARY OF THE DISCLOSURE

The present disclosure provides a fixing mechanism capable of assembling/disassembling one or more fan units quickly and conveniently to combine a fan module and an electronic device having the foresaid fixing mechanism for the heat dissipating function for solving above drawbacks.

According to the claimed disclosure, a fixing mechanism capable of installing at least one fan unit includes a casing, at least one positioning component, a fixing component and a resilient component. The casing includes a blocking slab and a plurality of lateral slabs, the plurality of lateral slabs is laterally connected with each other, and the blocking slab is disposed on first edges of the plurality of lateral slabs. An inlet is formed on second edges of the plurality of lateral slabs opposite to the first edges, and an outlet is formed on the blocking slab. The casing further includes at least one constraining portion disposed on a corresponding second edge of one of the plurality of lateral slabs. The least one positioning component is disposed inside the casing. An end of the positioning component is disposed on the blocking slab and the other end of the positioning component points toward the inlet. The fan unit is slidably disposed on the positioning component. The fixing component is located between the blocking slab and the fan unit. The fixing component includes a contacting portion slidably disposed on the positioning component. The resilient component is disposed on the positioning component. Two ends of the resilient component respectively contact against the blocking slab and the contacting portion. A resilient recovering force of the resilient component pushes the contacting portion to press the fan unit so as to abut the fan unit against the constraining portion.

According to the claimed disclosure, the casing further includes a guiding slot formed on one of the plurality of lateral slabs, the fixing component further includes a guiding block disposed on a lateral wall of the contacting portion and slidably assembled with the guiding slot.

According to the claimed disclosure, a plurality of lateral walls of the contacting portion respectively contacts against the plurality of lateral slabs in a slidable manner.

According to the claimed disclosure, the constraining portion is a dual-bending plate member, the constraining portion includes a first part and a second part, two opposite sides of the first part are respectively connected to one of the plurality of lateral slabs and the second part in a resilient manner.

According to the claimed disclosure, the casing further includes two constraining portions respectively disposed on two symmetrical lateral slabs, and a minimum distance between the two constraining portions is smaller than a width or a height of the fan unit.

According to the claimed disclosure, the casing further includes at least one gap formed on a position located between the adjacent lateral slabs and adjacent to the second edges.

According to the claimed disclosure, the fixing mechanism further includes at least one buffering component disposed on the positioning component, and located between the contacting portion and the fan unit or between a plurality of fan units.

According to the claimed disclosure, a length of each of the plurality of lateral slabs is greater than or equal to an amount of a length of the contacting portion and a length of the at least one fan unit.

According to the claimed disclosure, the casing further includes an engaging slot formed on one of the plurality of lateral slabs, the fixing mechanism further includes a handling component, and a resilient hook of the handling component is engaged with the engaging slot to assemble the handling component with the casing.

According to the claimed disclosure, at least one locking hole is formed on the blocking slab, and a locking component passes through the locking hole and a restraining component of a supporter to assemble the casing with the supporter.

According to the claimed disclosure, the fixing component further includes a guiding portion disposed on a surface of the contacting portion facing the blocking slab, and the guiding portion is pushed out or retracted into the outlet according to a movement of the contacting portion.

According to the claimed disclosure, an electronic device with heat dissipating function includes a base, a supporter disposed on the base, at least one fan unit, and at least one fixing mechanism detachably disposed on the supporter to install the fan unit. The fixing mechanism includes a casing, at least one positioning component, a fixing component and a resilient component. The casing includes a blocking slab and a plurality of lateral slabs, the plurality of lateral slabs is laterally connected with each other, and the blocking slab is disposed on first edges of the plurality of lateral slabs. An inlet is formed on second edges of the plurality of lateral slabs opposite to the first edges, and an outlet is formed on the blocking slab. The casing further includes at least one constraining portion disposed on a corresponding second edge of one of the plurality of lateral slabs. The least one positioning component is disposed inside the casing. An end of the positioning component is disposed on the blocking slab and the other end of the positioning component points toward the inlet. The fan unit is slidably disposed on the positioning component. The fixing component is located between the blocking slab and the fan unit. The fixing component includes a contacting portion slidably disposed on the positioning component. The resilient component is disposed on the positioning component. Two ends of the resilient component respectively contact against the blocking slab and the contacting portion. A resilient recovering force of the resilient component pushes the contacting portion to press the fan unit so as to abut the fan unit against the constraining portion.

According to the claimed disclosure, the supporter includes a plurality of restraining components for contacting against the casing, and the fixing mechanism utilizes a locking component to pass through a locking hole formed on the blocking slab of the casing and one of the plurality of restraining components.

The fixing mechanism of the present disclosure combines the plurality of fan units in series connection, in parallel connection, or in series and parallel connection to increase airflow guiding ability of the fan module. The fixing component of the fixing mechanism has the guiding portion, which preferably aligns with or protrudes from the outlet of the casing no matter how many fan units are disposed inside the casing. The airflow generated by the fan unit can be exhausted out of the casing through the guiding portion, to avoid the heat dissipating efficiency from being damaged by the turbulence inside the casing. The resilient component can push the fixing component and the several fan units toward the outlet, so as to abut the outer fan unit tightly against the constraining portion of the casing, and the vibration of the fan unit can be effectively eliminated by the positioning component and/or the resilient component. Comparing to the prior art, the fixing mechanism of the present disclosure can assemble the fan units with any amount according to actual demand, and further provide a quick assembling function for conveniently assembling and disassembling the fan unit without tools.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
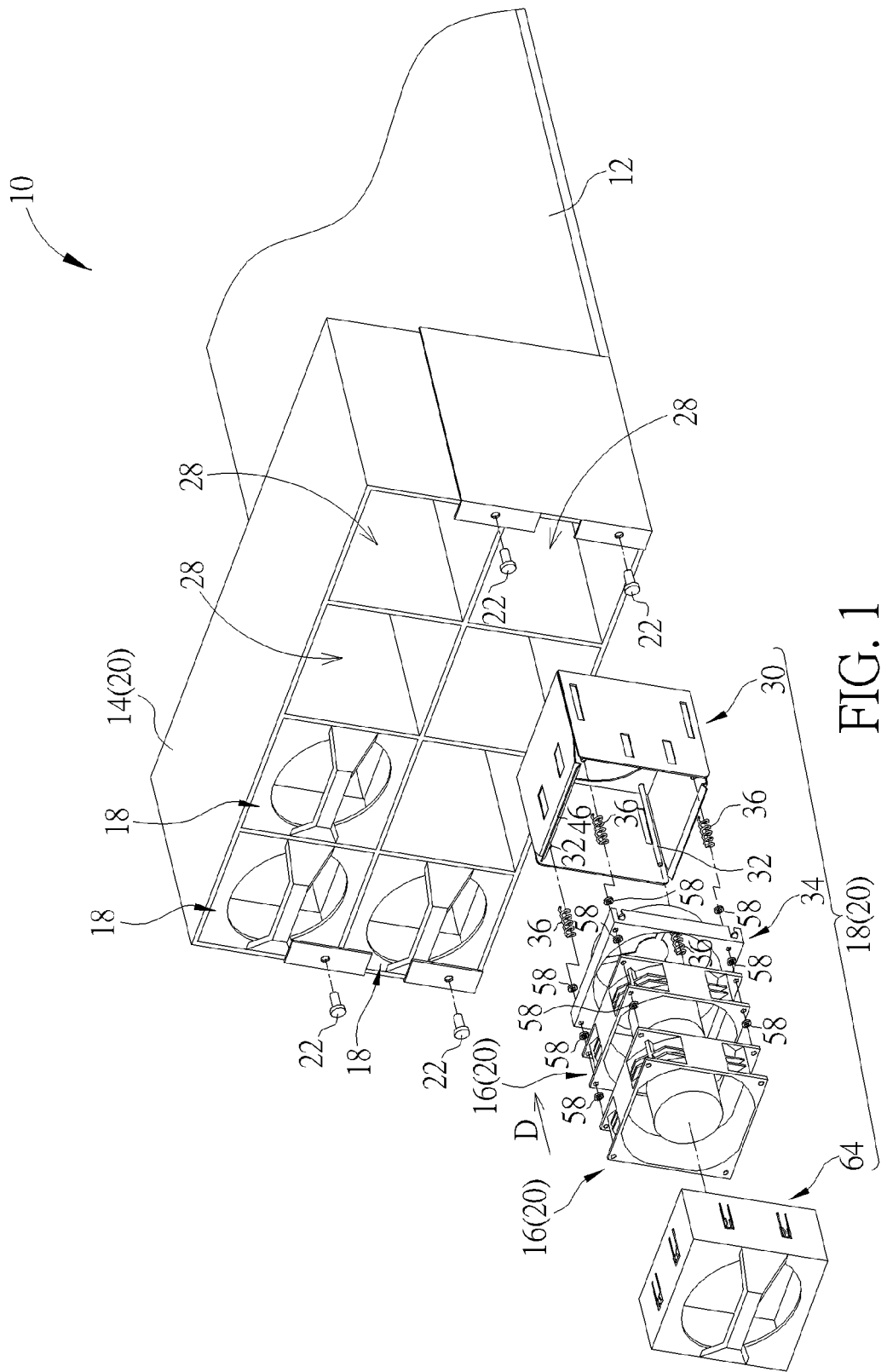
FIG. 1 and FIG. 2 respectively are diagrams of an electronic device in different views according to an embodiment of the present disclosure.
Figure 2:
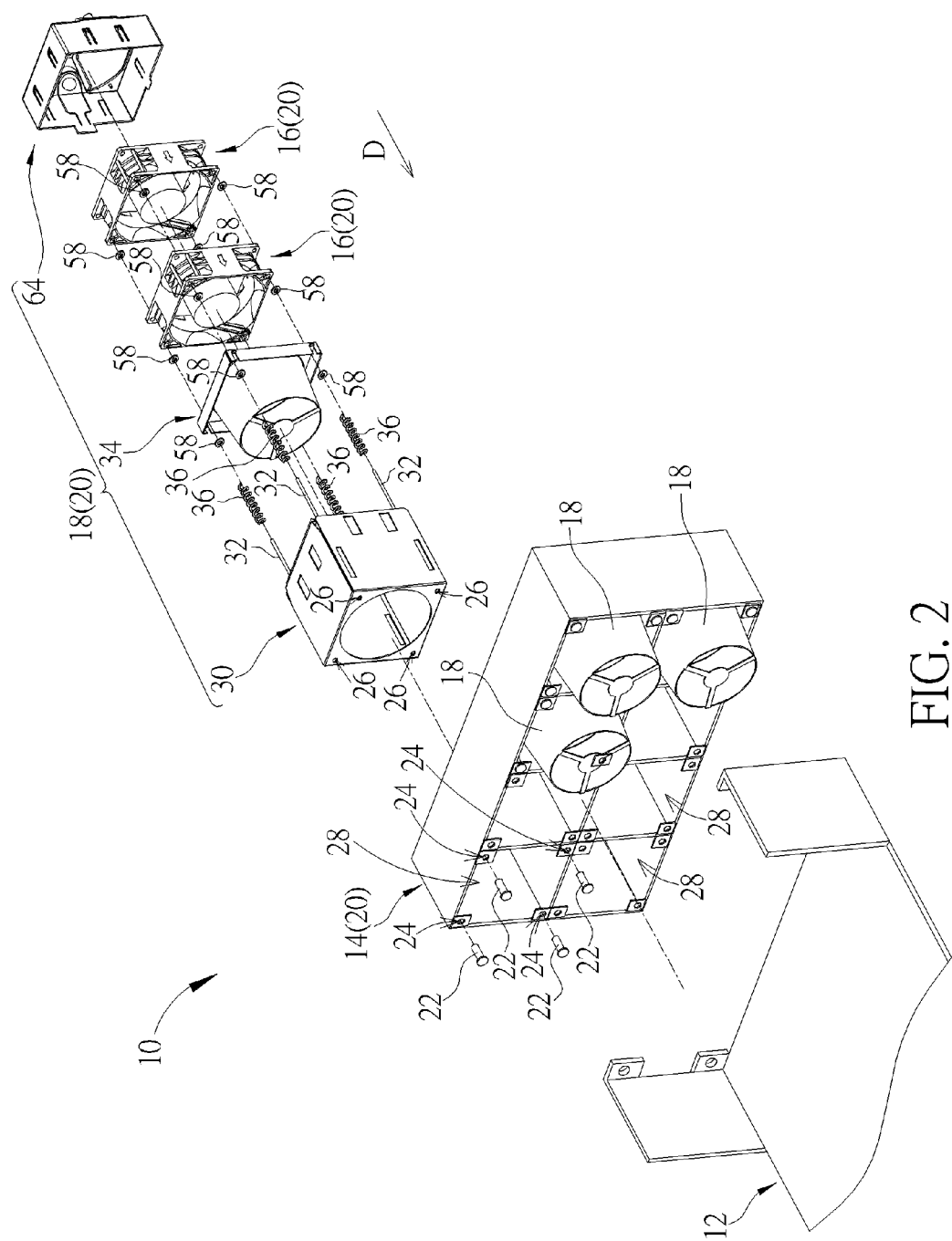
Figure 9:
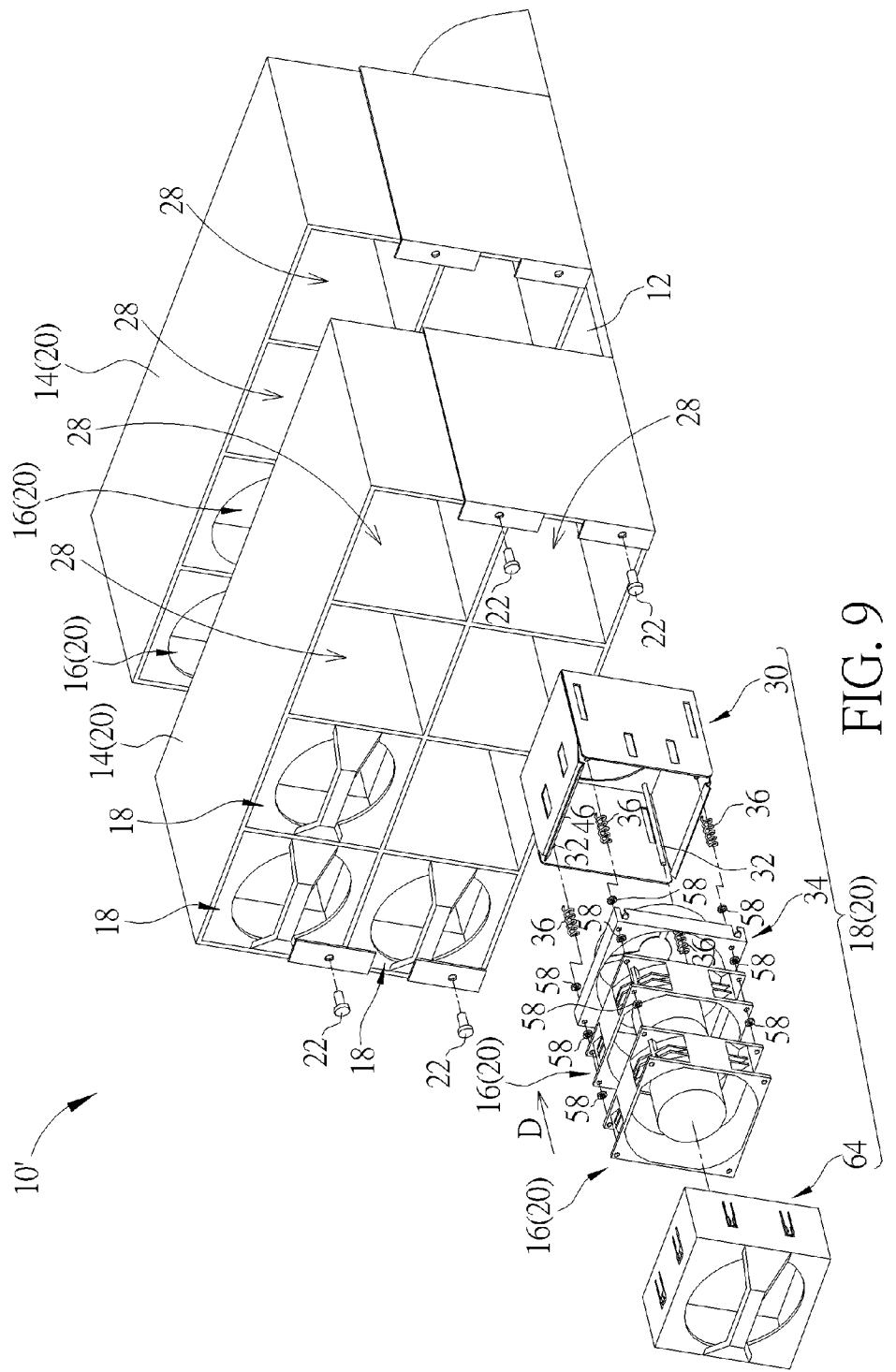
FIG. 9 is a diagram of an electronic device according to another embodiment of the present disclosure.

Please refer to FIG. 1, FIG. 2 and FIG. 9. FIG. 1 and FIG. 2 respectively are diagrams of an electronic device 10 in different views according to an embodiment of the present disclosure. FIG. 9 is a diagram of an electronic device 10' according to another embodiment of the present disclosure. The electronic device 10 includes a base 12, a supporter 14, a plurality of fan units 16 and a plurality of fixing mechanisms 18. The electronic device 10 can be a server apparatus. The base 12 is utilized to hold several heat-generating components, such as the circuit board, the hard disk and the processor, of the server apparatus. One or more fan units 16 can be installed inside each fixing mechanism 18 according to design demand. The plurality of fixing mechanisms 18 can be detachably disposed on the supporter 14 to form a fan module 20. The fan module 20 is an independent structure with portable convenience. The fan module 20 is disposed on the base 12, and a locking component 22 passes through the base 12 and the supporter 14 to fix position of the fan module 20 upon the base 12.

The supporter 14 includes a plurality of restraining components 24 which is utilized to stop a movement of the fixing mechanism 18 relative to the supporter 14. The supporter 14 can be a metal unit (such as the unit made by iron material), and the restraining component 24 is a bending-slice structure formed on the metal unit by press stamping technique. A locking hole 26 is formed on a casing 30 of the fixing mechanism 18, and the locking component 22 passes through the restraining component 24 and the locking hole 26 to fix the fixing mechanism 18 on the supporter 14. The supporter 14 has a plurality of chambers 28 formed by partitions. Each chamber 28 is filled by the single fixing mechanism 18, and each fixing mechanism 18 can have one or more fan units 16. The fan module 20 mainly composed of the supporter 14, the fan unit 16 and the fixing mechanism 18 can adjust airflow rate according to actual demand, such as adjusting numbers of the fan unit 16 or combining several fan modules in series connection, in parallel connection or in series/parallel connection, so as to enhance heat dissipating efficiency.

As shown in FIG. 9, the electronic device 10' includes two fan modules 20 disposed on the base 12 in series connection. Each fan module 20 has eight fan units 16 arranged in parallel connection, the fan units 16 respectively disposed on the two fan modules 20 and corresponding to each other are united to generate combinative airflow, and the sixteen fan units 16 of the two fan modules 20 can provide sufficient cooling airflow by series/parallel connection. Amount and arrangement of the fan unit 16 and the fan module 20 are not limited to the above-mentioned connection, which depends on design demand.

Figure 3:
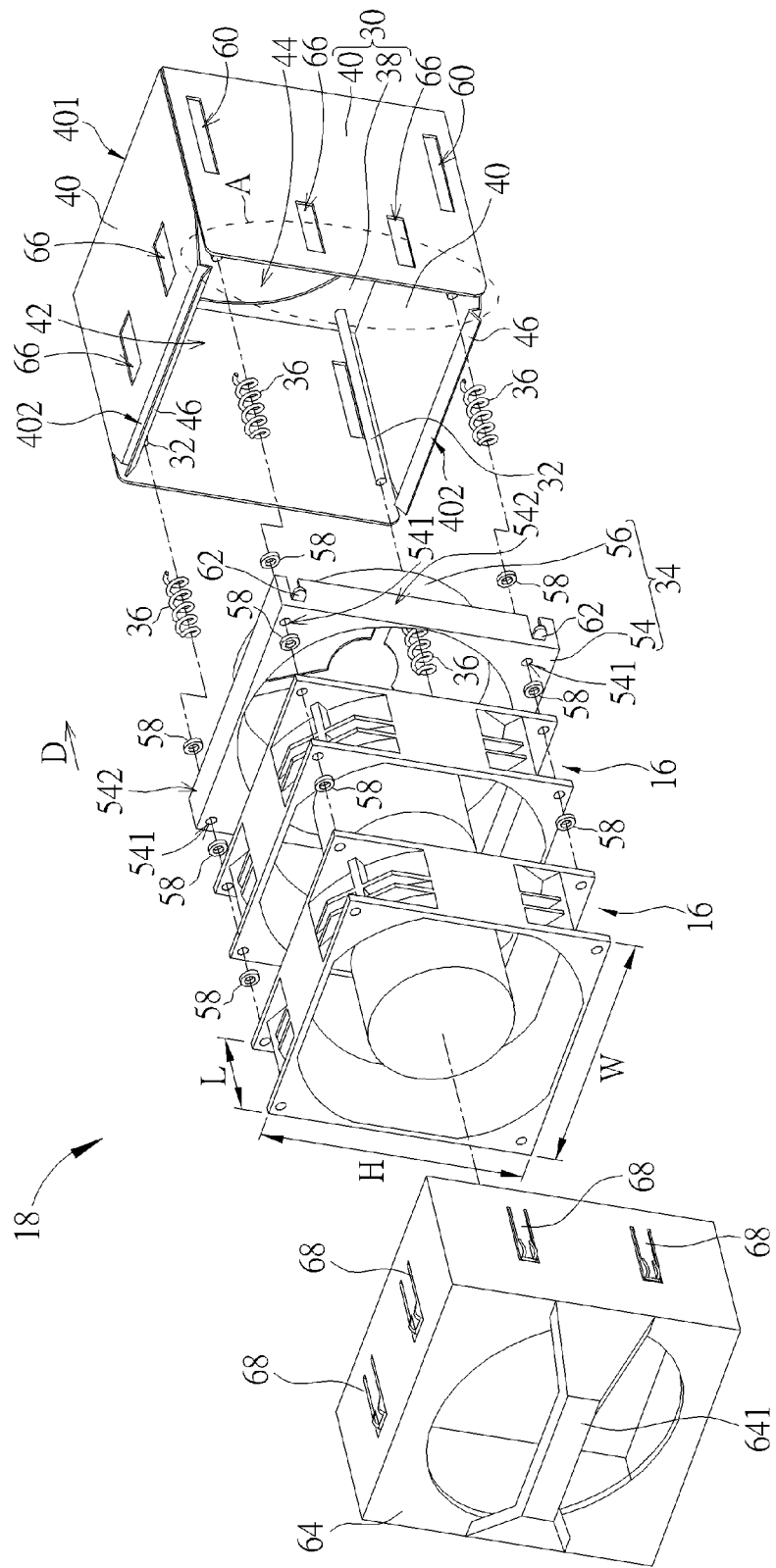
FIG. 3 and FIG. 4 respectively are exploded diagrams of a fixing mechanism in different views according to the embodiment of the present disclosure.
Figure 4:
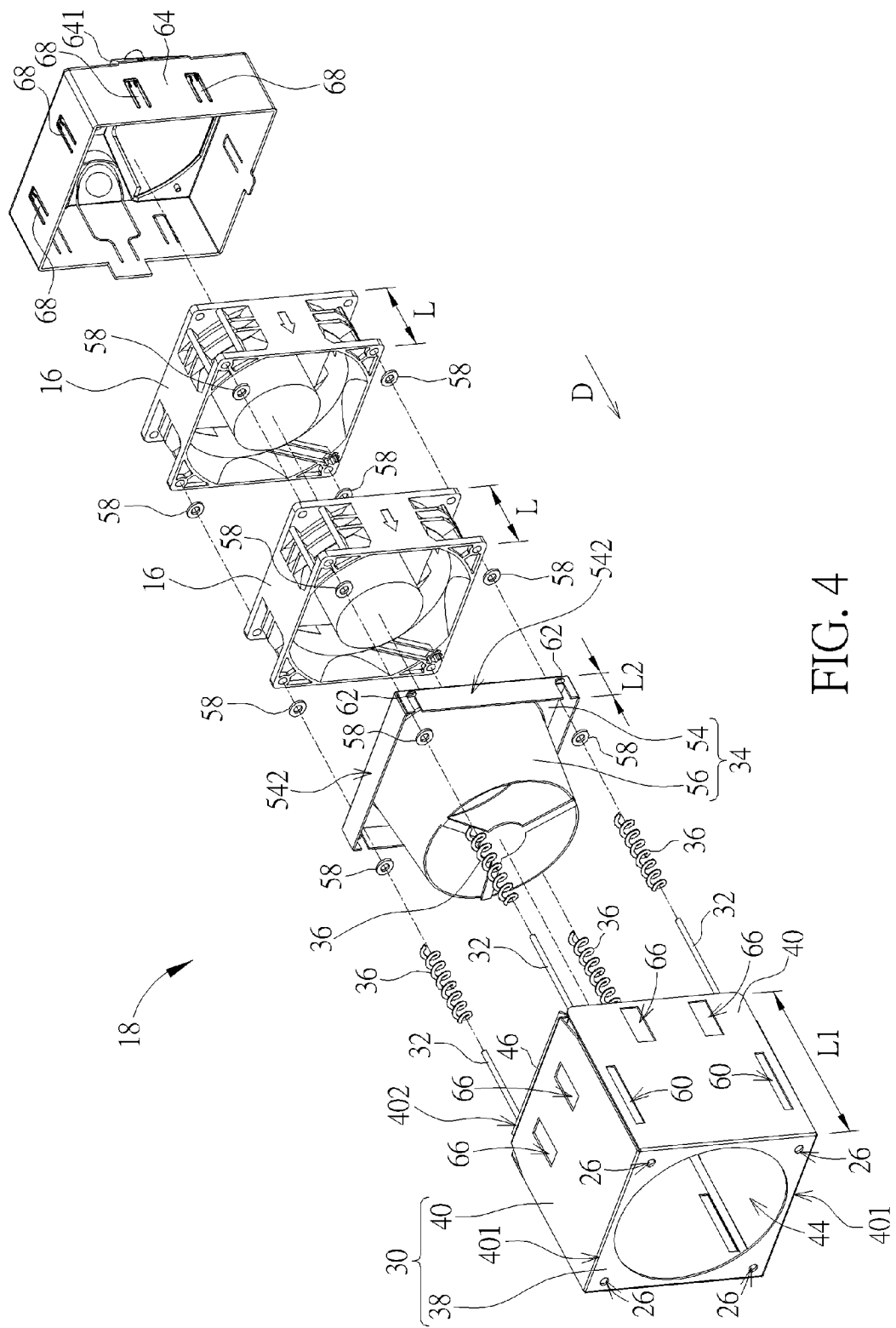
Figure 5:
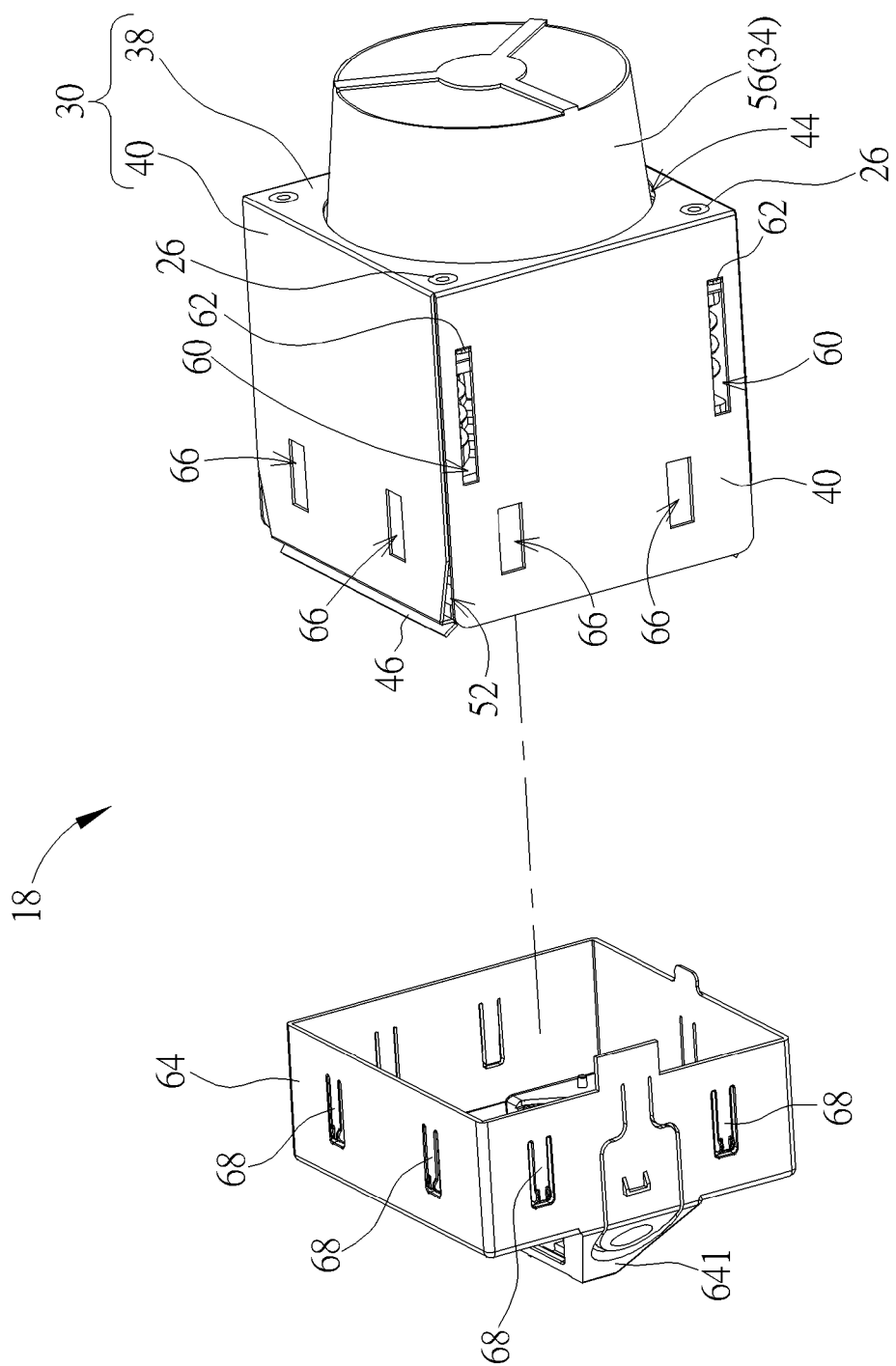
FIG. 5 is an assembly diagram of the fixing mechanism according to the embodiment of the present disclosure.
Figure 6:
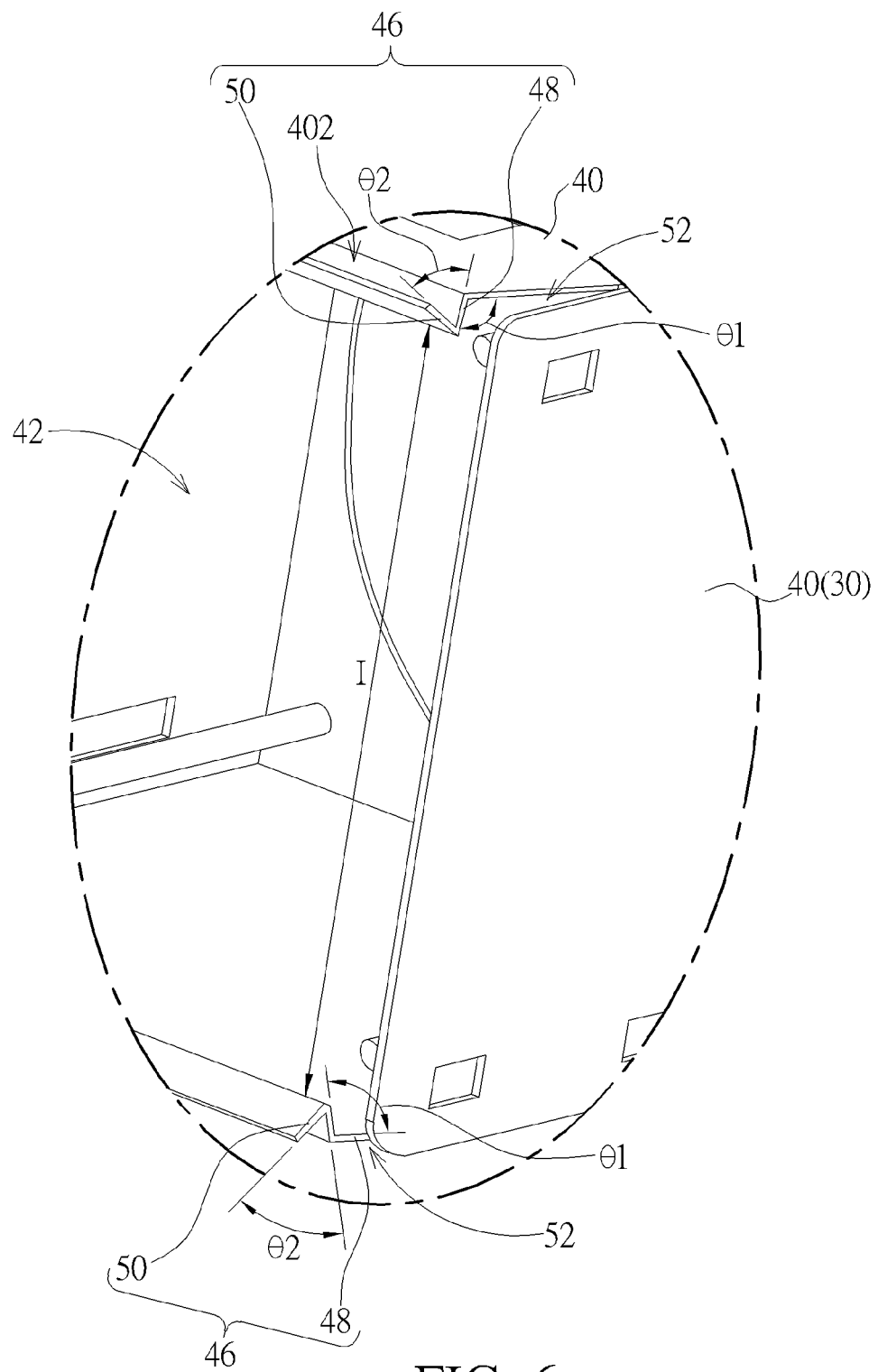
FIG. 6 is an enlarged diagram of a section A of the fixing mechanism shown in FIG. 3.

Please refer to FIG. 3 to FIG. 6. FIG. 3 and FIG. 4 respectively are exploded diagrams of the fixing mechanism 18 in different views according to the embodiment of the present disclosure. FIG. 5 is an assembly diagram of the fixing mechanism 18 according to the embodiment of the present disclosure. FIG. 6 is an enlarged diagram of a section A of the fixing mechanism 18 shown in FIG. 3. The fixing mechanism 18 includes the casing 30, a positioning component 32, a fixing component 34 and a resilient component 36. The casing 30 is mainly composed of one blocking slab 38 and four lateral slabs 40. An amount of the lateral slab 40 is designed according to a shape of the fan unit 16. The plurality of lateral slabs 40 is laterally connected with each other, and edges of each lateral slab 40 that are not connected to the adjacent lateral slab 40 are defined as a first edge 401 and a second edge 402. The blocking slab 38 is disposed on the first edges 401 of the lateral slabs 40. An inlet 42 is formed between the surrounding second edges 402, and an outlet 44 is formed on the blocking slab 38. Further, the casing 30 may include two constraining portions 46 respectively disposed on the second edges 402 of the symmetrical lateral slabs 40.

The constraining portions 46 not only can be disposed on the symmetrical lateral slabs 40, but also can be disposed on the whole lateral slabs 40 optionally. As shown in FIG. 6, The constraining portion 46 preferably is a dual-bending plate member which includes a first part 48 and a second part 50. Two opposite sides of the first part 48 are respectively connected to the corresponding lateral slab 40 and the second part 50 in a resilient manner. An angle θ1 formed between the first part 48 and the lateral slab 40 is substantially equal to, but not limited to, 90 degrees. An angle θ2 formed between the first part 48 and the second part 50 is substantially smaller than, but not limited to, 90 degrees. A minimum distance I (an interval between boundaries of the first part 48 and the second part 50) between the two constraining portions 46 is preferably smaller than a width W or a height H of the fan unit 16. While the fan unit 16 is disposed inside the casing 30, the first part 48 can contact against the fan unit 16 to prevent the fan unit 16 from falling out of the casing 30. The second part 50 provides an inclined surface where an external force is applied to deform the first part 48 relative to the lateral slab 40, so as to remove structural interference of the constraining portion 46 for assembly or disassembly of the fan unit 16.

It should be mentioned that the casing 30 preferably includes at least one gap 52 formed on a position located between the adjacent lateral slabs 40 and adjacent to the second edges 402. As shown in FIG. 6, an end of each lateral slab 40 which is close to the inlet 42 is not completely connected to the adjacent lateral slab 40, and the foresaid ends of the adjacent lateral slabs 40 are separated and partially tilted. The gap 52 is helpful to increase deformation amount of the constraining portion 46 when being pressed, and the fan unit 16 can be easily assembled with or disassembled from the fixing mechanism 18. It is to say, while the fan unit 16 moves into the casing 30 via the inlet 42 in an assembling direction D, the fan unit 16 presses upon the second part 50 to push the two constraining portions 46 outwardly by resilient deformation, and the fan unit 16 is free to move into the casing 30. For disassembly of the fan unit 16, the second part 50 can be forced to outwardly push the constraining portion 46, and the fan unit 16 can be separated from the casing 30 in a direction opposite to the assembling direction D.

An amount of the positioning component 32 can be one or more, and the plurality of positioning components 32 is symmetrically disposed inside the casing 30. An end of the positioning component 32 is preferably fixed on the blocking slab 38 by a rivet, and the other end of the positioning component 32 is a free end pointing toward the inlet 42 (or toward the corresponding constraining portion 46). The positioning component 32 stretches from the inlet 42 to the outlet 44, so the fixing component 34 slidably disposed on the positioning component 32 can utilize a guiding portion 56 to guide the cooling airflow from the inlet 42 to the outlet 44. The resilient component 36, the fixing component 34 and the fan unit 16 are slidably disposed on the positioning component 32 in sequence to be installed inside the casing 30. The fixing component 34 may include a contacting portion 54 and a guiding portion 56. The fixing component 34 is slidably disposed on the positioning component 32 via a piercing hole 541 formed on the contacting portion 54. A plurality of lateral walls 542 of the contacting portion 54 can respectively contact the corresponding lateral slabs 40 in a slidable manner, to ensure that the contacting portion 54 can freely move inside the casing 30 along an axial direction (which is substantially parallel to the assembling direction D) of the positioning component 32. The contacting portion 54 is close to the casing 30 to minimize an interval between the contacting portion 54 and the casing 30, so as to prevent turbulence and to increase heat-dissipating efficiency of the fixing mechanism 18. The guiding portion 56 is disposed on a surface of the contacting portion 54 facing the blocking slab 38. The guiding portion 56 can be a wind-gathering mask shown in FIG. 3. The guiding portion 56 moves inside the casing 30 to be pushed out or be retracted into the outlet 44 accordingly with a movement of the contacting portion 54. The guiding portion 56 is utilized to guide the cooling airflow generated by the fan unit 16 to flow out of the casing 30 without turbulence.

An amount of the resilient component 36 corresponds to an amount of the positioning component 32. The resilient component 36 can be an extension spring or a compression spring disposed on the positioning component 32. Two ends of the resilient component 36 respectively contact against the casing 30 (such as the blocking slab 38) and the fixing component 34 (such as the contacting portion 54). A resilient recovering force of the resilient component 36 pushes the fixing component 34 to move toward the inlet 42 along the axial direction of the positioning component 32, so that the contacting portion 54 of the fixing component 34 can press the fan unit 16 to tightly contact the fan unit 16 against the constraining portion 46. Besides, the fixing mechanism 18 may optionally dispose a plurality of buffering components 58 on the positioning component 32, and the plurality of buffering components 58 can be respectively located between the contacting portion 54 and the fan unit 16, or between the adjacent fan units 16 disposed on the same axle. The buffering component 58 is made of soft material, such as rubber or spongy, to absorb vibration of the fan unit 16.

As shown in FIG. 3 to FIG. 5, the casing 30 further includes a guiding slot 60 formed on the lateral slab 40, and the fixing component 34 further includes a guiding block 62 disposed on the lateral wall 542 of the contacting portion 54. While the lateral wall 542 slidably contacts the lateral slab 40, the guiding block 62 can be assembled with the guiding slot 60 in a slidable manner. A main body of the fixing component 34 is normally made of plastic material, so the guiding block 62 can be engaged into the guiding slot 60 by compressed deformation, and assembly of the guiding slot 60 and the guiding block 62 is utilized to orient a movement of the fixing component 34. The fixing mechanism 18 further may include a handling component 64 connected to the casing 30. The user can pull or push a handle 641 of the handling component 64 to move the fixing mechanism 18. The casing 30 can include an engaging slot 66 formed on the lateral slab 40, and a resilient hook 68 of the handling component 64 can be engaged with the engaging slot 66 to assemble the handling component 66 and the casing 30.

The fixing mechanism 18 can accommodate one or more fan units 16 to establish the fan unit assembly in series connection, the plurality of fixing mechanisms 18 can be respectively disposed on the chambers 28 of the supporter 14 to establish the fan unit assembly in parallel connection, and the fan module 20 can combine the plurality of fan units 16 with each other in series connection and/or parallel connection by the above-mentioned states to increase the heat dissipating efficiency of the electronic device 10. Two embodiments are illustrated to introduce a type of the fixing mechanism 18 having one fan unit 16 and another type of the fixing mechanism 18 having two fan units 16. Numbers of the fan unit 16 within the fixing mechanism 18 are not limited to the above-mentioned types, which depend on actual demand. Design of the fixing mechanism 18 that conforms to limitation of a length L1 of the lateral slab 40 being longer than or equal to an amount of a length L2 of the contacting portion 54 and lengths L of the fan units 16 belongs to scope of the present disclosure, which means the fixing mechanism 18 can install three or more fan units 16 arbitrarily.

Figure 7:
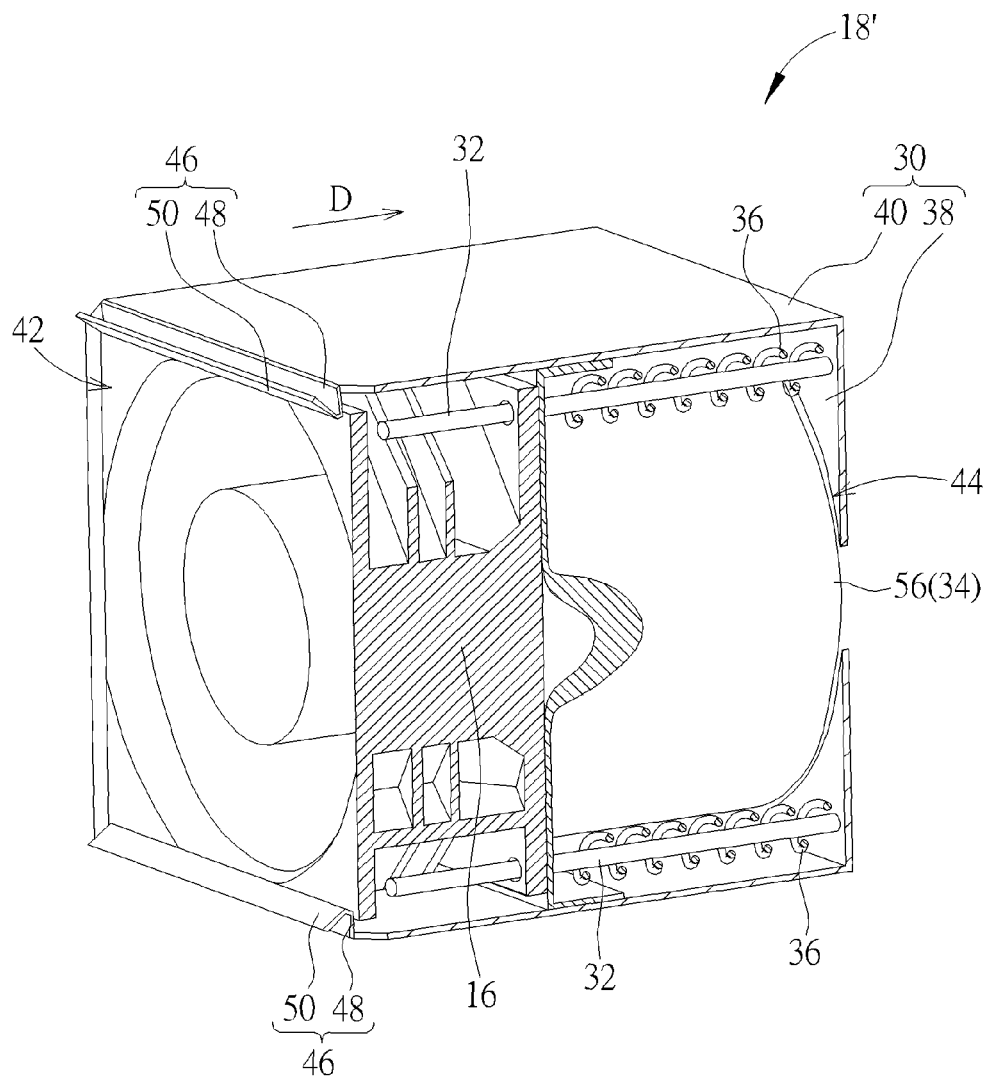
FIG. 7 is a partial diagram of the fixing mechanism according to a first embodiment of the present disclosure.

Please refer to FIG. 7. FIG. 7 is a partial diagram of the fixing mechanism 18' according to a first embodiment of the present disclosure. The fixing mechanism 18' in the first embodiment has one fan unit 16. The positioning component 32 is mounted on the casing 30, the resilient component 36 is disposed on the positioning component 32, and then the fixing component 34 and the fan unit 16 are disposed on the positioning component 32 in sequence. The buffering component 58 (not shown in FIG. 7) can be optionally disposed between the fixing component 34 and the fan unit 16. While the fan unit 16 enters the casing 30, the resilient recovering force of the resilient component 36 pushes the fixing component 34 toward the inlet 42, and the fixing component 34 pushes the fan unit 16 to abut against the first part 48 of the constraining portion 46 accordingly. Because the angle θ1 between the first part 48 and the lateral slab 40 is substantially equal to 90 degrees, the constraining portion 46 can effectively contact against the fan unit 16 to prevent the fan unit 16 and the casing 30 from separation while there is no force applied to the second part 50. In the meantime, the guiding portion 56 of the fixing component 34 is mostly located inside the casing 30, an opening of the guiding portion 56 at least aligns with the outlet 44, and the cooling airflow generated by the fan unit 16 can be exhausted from the casing 30 through the guiding portion 56.

Vibration is generated while the fan unit 16 is operated, and the fixing mechanism 18' utilizes the positioning component 32 and the resilient component 36 to retard the vibration for preventing the vibration of the fan unit 16 from being transmitted to other components of the electronic device 10. The positioning component 32 preferably can be a bar structure, such as the positioning bar capable of guiding the fixing component 34 and the fan unit 16 into the casing 30. The positioning component 32 is mounted on the casing 30 for stable assembly. The positioning component 32 is utilized to avoid the fan unit 16 from shaking, which means the fan unit 16 does not hit the casing 30 and/or the fixing component 34. Resilient deformation of the resilient component 36 not only can push the fan unit 16 to abut against the constraining portion 46 for fixed position, but also absorb high frequency vibration generated by the operating fan unit 16. The fixing mechanism 18' can effectively eliminate shake or vibration of the fan unit 16 by design of the positioning component 32 and the resilient component 36.

Figure 8:
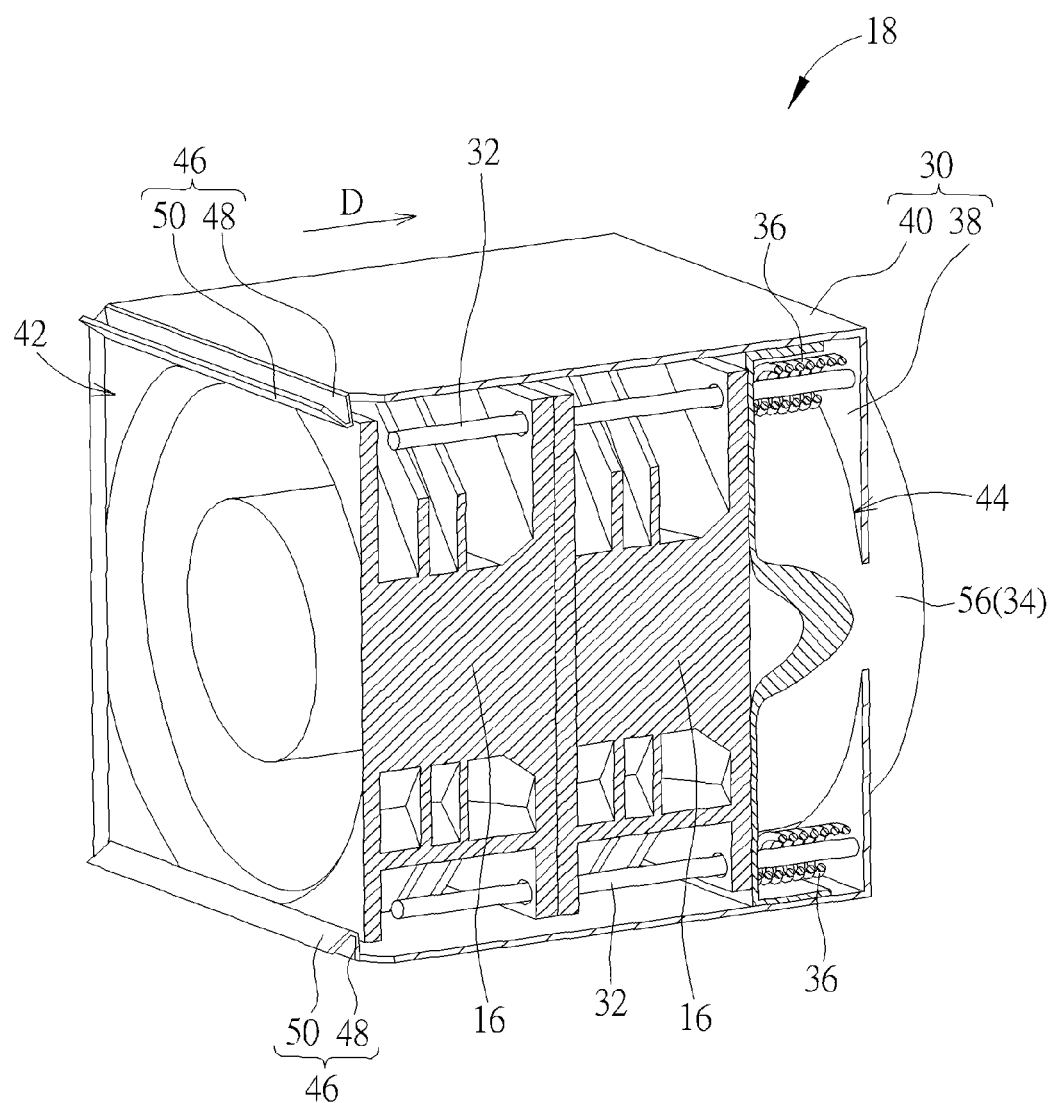
FIG. 8 is a partial diagram of the fixing mechanism according to a second embodiment of the present disclosure.

Please refer to FIG. 8. FIG. 8 is a partial diagram of the fixing mechanism 18 according to a second embodiment of the present disclosure. Difference between the second embodiment and the first embodiment is an amount of the fan unit 16, and elements in the second embodiment having the same numeral as ones of the first embodiment have the same structures and functions, and a detailed description is omitted herein for simplicity. In order to dispose the plurality of fan units 16 on the fixing mechanism 18, the second fan unit 16 (or the Nth fan unit 16, N is an integer and greater than or equal to 2) moves into the casing 30 in the assembling direction D. The Nth fan unit 16 moves the fan unit 16 and the fixing component 34 inside the casing 30 toward the outlet 44 while entering the casing 30, the resilient component 36 is compressed and deformed accordingly. As the Nth fan unit 16 moves across the constraining portion 46, the resilient recovering force of the resilient component 36 reversely pushes the fixing component 34 and the fan unit 16 (in the direction opposite to the assembling direction D), and the Nth fan unit 16 can tightly abut against the constraining portion 46. Therefore, the positioning component 32 is utilized to constrain position of the plurality of fan units 16 simultaneously, and the shake or vibration of the plurality of fan units 16 can be eliminated by the resilient deformation of the resilient component 36 and the buffering component 58.

In conclusion, the fixing mechanism of the present disclosure combines the plurality of fan units in series connection, in parallel connection, or in series and parallel connection to increase airflow guiding ability of the fan module. The fixing component of the fixing mechanism has the guiding portion, which preferably aligns with or protrudes from the outlet of the casing no matter how many fan units are disposed inside the casing. The airflow generated by the fan unit can be exhausted out of the casing through the guiding portion, to avoid the heat dissipating efficiency from being damaged by the turbulence inside the casing. The resilient component can push the fixing component and the several fan units toward the outlet, so as to abut the outer fan unit tightly against the constraining portion of the casing, and the vibration of the fan unit can be effectively eliminated by the positioning component and/or the resilient component. Comparing to the prior art, the fixing mechanism of the present disclosure can assemble the fan units with any amount according to actual demand, and further provide a quick assembling function for conveniently assembling and disassembling the fan unit without tools.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A fixing mechanism capable of installing at least one fan unit, the fixing mechanism comprising:
   a casing, the casing comprising a blocking slab and a plurality of lateral slabs, the plurality of lateral slabs being laterally connected with each other, the blocking slab being disposed on first edges of the plurality of lateral slabs, an inlet being formed on second edges of the plurality of lateral slabs opposite to the first edges, and an outlet being formed on the blocking slab, the casing further comprising at least one constraining portion disposed on a corresponding second edge of one of the plurality of lateral slabs;
   at least one positioning component disposed inside the casing, an end of the positioning component being disposed on the blocking slab and the other end of the positioning component pointing toward the inlet, the fan unit being slidably disposed on the positioning component;
   a fixing component located between the blocking slab and the fan unit, the fixing component comprising a contacting portion slidably disposed on the positioning component; and
   a resilient component disposed on the positioning component, two ends of the resilient component respectively contacting against the blocking slab and the contacting portion, a resilient recovering force of the resilient component pushing the contacting portion to press the fan unit so as to abut the fan unit against the constraining portion.

2. The fixing mechanism of claim 1, wherein the casing further comprises a guiding slot formed on one of the plurality of lateral slabs, the fixing component further comprises a guiding block disposed on a lateral wall of the contacting portion and slidably assembled with the guiding slot.

3. The fixing mechanism of claim 1, wherein a plurality of lateral walls of the contacting portion respectively contacts against the plurality of lateral slabs in a slidable manner.

4. The fixing mechanism of claim 1, wherein the constraining portion is a dual-bending plate member, the constraining portion comprises a first part and a second part, two opposite sides of the first part are respectively connected to one of the plurality of lateral slabs and the second part in a resilient manner.

5. The fixing mechanism of claim 4, wherein the casing further comprises two constraining portions respectively disposed on two symmetrical lateral slabs, a minimum distance between the two constraining portions is smaller than a width or a height of the fan unit.

6. The fixing mechanism of claim 1, wherein the casing further comprises at least one gap formed on a position located between the adjacent lateral slabs and adjacent to the second edges.

7. The fixing mechanism of claim 1, further comprising:
at least one buffering component disposed on the positioning component, and located between the contacting portion and the fan unit or between a plurality of fan units.

8. The fixing mechanism of claim 1, wherein a length of each of the plurality of lateral slabs is greater than or equal to an amount of a length of the contacting portion and a length of the at least one fan unit.

9. The fixing mechanism of claim 1, wherein the casing further comprises an engaging slot formed on one of the plurality of lateral slabs, the fixing mechanism further comprises a handling component, and a resilient hook of the handling component is engaged with the engaging slot to assemble the handling component with the casing.

10. The fixing mechanism of claim 1, wherein at least one locking hole is formed on the blocking slab, a locking component passes through the locking hole and a restraining component of a supporter to assemble the casing with the supporter.

11. The fixing mechanism of claim 1, wherein the fixing component further comprises a guiding portion disposed on a surface of the contacting portion facing the blocking slab, the guiding portion is pushed out or retracted into the outlet according to a movement of the contacting portion.

12. An electronic device with heat dissipating function, comprising:
a base;
a supporter disposed on the base;
at least one fan unit; and
at least one fixing mechanism detachably disposed on the supporter to install the fan unit, the fixing mechanism comprising:
a casing, the casing comprising a blocking slab and a plurality of lateral slabs, the plurality of lateral slabs being laterally connected with each other, the blocking slab being disposed on first edges of the plurality of lateral slabs, an inlet being formed on second edges of the plurality of lateral slabs opposite to the first edges, and an outlet being formed on the blocking slab, the casing further comprising at least one constraining portion disposed on a corresponding second edge of one of the plurality of lateral slabs;
at least one positioning component disposed inside the casing, an end of the positioning component being disposed on the blocking slab and the other end of the positioning component pointing toward the inlet, the fan unit being slidably disposed on the positioning component;
a fixing component located between the blocking slab and the fan unit, the fixing component comprising a contacting portion slidably disposed on the positioning component; and
a resilient component disposed on the positioning component, two ends of the resilient component respectively contacting against the blocking slab and the contacting portion, a resilient recovering force of the resilient component pushing the contacting portion to press the fan unit so as to abut the fan unit against the constraining portion.

13. The electronic device of claim 12, wherein the casing further comprises a guiding slot formed on one of the plurality of lateral slabs, the fixing component further comprises a guiding block disposed on a lateral wall of the contacting portion and slidably assembled with the guiding slot.

14. The electronic device of claim 12, wherein a plurality of lateral walls of the contacting portion respectively contacts against the plurality of lateral slabs in a slidable manner.

15. The electronic device of claim 12, wherein the constraining portion is a dual-bending plate member, the constraining portion comprises a first part and a second part, two opposite sides of the first part are respectively connected to one of the plurality of lateral slabs and the second part in a resilient manner.

16. The electronic device of claim 15, wherein the casing further comprises two constraining portions respectively disposed on two symmetrical lateral slabs, a minimum distance between the two constraining portions is smaller than a width or a height of the fan unit.

17. The electronic device of claim 12, wherein the casing further comprises at least one gap formed on a position located between the adjacent lateral slabs and adjacent to the second edges.

18. The electronic device of claim 12, wherein the fixing mechanism further comprises at least one buffering component disposed on the positioning component and located between the contacting portion and the fan unit or between a plurality of fan units.

19. The electronic device of claim 12, wherein a length of each of the plurality of lateral slabs is greater than or equal to an amount of a length of the contacting portion and a length of the at least one fan unit.

20. The electronic device of claim 12, wherein the casing further comprises an engaging slot formed on one of the plurality of lateral slabs, the fixing mechanism further comprises a handling component, and a resilient hook of the handling component is engaged with the engaging slot to assemble the handling component with the casing.

21. The electronic device of claim 12, wherein the supporter comprises a plurality of restraining components for contacting against the casing, and the fixing mechanism utilizes a locking component to pass through a locking hole formed on the blocking slab of the casing and one of the plurality of restraining components.

22. The electronic device of claim 12, wherein the fixing component further comprises a guiding portion disposed on a surface of the contacting portion facing the blocking slab, the guiding portion is pushed out or retracted into the outlet according to a movement of the contacting portion.

* * * * *